United States Patent
Schrott et al.

(10) Patent No.: US 7,491,573 B1
(45) Date of Patent: Feb. 17, 2009

(54) PHASE CHANGE MATERIALS FOR APPLICATIONS THAT REQUIRE FAST SWITCHING AND HIGH ENDURANCE

(75) Inventors: Alejandro G Schrott, New York, NY (US); Chung H Lam, Peekskill, NY (US); Simone Raoux, Santa Clara, CA (US); Chieh-Fang Chen, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/047,459

(22) Filed: Mar. 13, 2008

(51) Int. Cl. *H01L 21/336* (2006.01)

(52) U.S. Cl. .......... 438/95; 438/102; 438/103; 438/257; 438/604; 438/FOR. 256; 438/FOR. 267; 438/FOR. 292; 438/FOR. 344; 257/E21.662; 257/E21.679; 257/E27.104; 257/E31.029

(58) Field of Classification Search ............ 438/95, 438/102, 103, 257, 604, FOR. 256, FOR. 267, 438/FOR. 292, FOR. 344; 257/298, E21.662, 257/E21.679, E27.104, E31.029
See application file for complete search history.

(56) References Cited

U.S. PATENT DOCUMENTS

| | | | |
|---|---|---|---|
| 4,213,781 A | 7/1980 | Noreika et al. | |
| 5,825,046 A | 10/1998 | Czubatyj et al. | |
| 6,147,395 A | 11/2000 | Gilgen | |
| 6,329,666 B1 | 12/2001 | Doan et al. | |
| 6,731,528 B2 | 5/2004 | Hush et al. | |
| 6,784,018 B2 | 8/2004 | Campbell et al. | |
| 6,894,305 B2 | 5/2005 | Yi et al. | |
| 7,067,348 B2 | 6/2006 | Campbell et al. | |
| 7,071,021 B2 | 7/2006 | Harshfield et al. | |
| 7,102,150 B2 | 9/2006 | Harshfield et al. | |
| 2003/0049912 A1 | 3/2003 | Campbell et al. | |
| 2005/0226062 A1 | 10/2005 | Aratani et al. | |
| 2006/0105556 A1 | 5/2006 | Matsui et al. | |
| 2006/0226409 A1 | 10/2006 | Burr et al. | |
| 2006/0238185 A1 | 10/2006 | Kozicki | |
| 2006/0279328 A1 | 12/2006 | Kozicki et al. | |
| 2007/0001160 A1 | 1/2007 | Cheong et al. | |
| 2007/0029537 A1 | 2/2007 | Campbell | |
| 2007/0121374 A1 | 5/2007 | Lung et al. | |
| 2007/0217273 A1 | 9/2007 | Choi et al. | |
| 2007/0235712 A1 | 10/2007 | Harshfield et al. | |
| 2007/0267622 A1 | 11/2007 | Ovshinsky | |
| 2007/0285962 A1 | 12/2007 | Yen et al. | |
| 2007/0290185 A1 | 12/2007 | Wang | |
| 2007/0295949 A1 | 12/2007 | Lee | |
| 2008/0006810 A1 | 1/2008 | Park et al. | |

FOREIGN PATENT DOCUMENTS

WO 2007029938 3/2007

OTHER PUBLICATIONS

Afonso, C N, et al. Ultrafast erasable optical storage in Sb-rich GeSb films. The 1994 Conference on Lasers and Electro-Optics Europe, Amsterdam, Netherlands, IEEE Piscataway NJ (Aug. 28-Sep. 2, 1994).

Solis, et al. Fast crystallizing GeSb alloys for optical-data storage. Journal of Applied Physics, 75(12), 7788-7794 (Jun. 15, 1994).

*Primary Examiner*—Thanh V Pham
(74) *Attorney, Agent, or Firm*—Leander F. Aulisio

(57) ABSTRACT

A memory device utilizing a phase change material as the storage medium, the phase change material based on antimony as the solvent in a solid solution.

1 Claim, 5 Drawing Sheets

PHASE CHANGE MATERIALS FOR APPLICATIONS THAT REQUIRE FAST SWITCHING AND HIGH ENDURANCE

The present invention relates to a solid solution phase change material, and more particularly, to a nonvolatile memory device employing a solid solution phase change material as the memory element.

BACKGROUND OF THE INVENTION

Phase change materials (PCMs) undergo fast reversible phase changes in response to an external stimulus, such as heat. The phase change is associated with a change in a physical property, such as electrical resistance or optical reflectivity, which can be measured to determine the phase of the material. PCMs are typically switched between a largely amorphous state and a largely crystalline state. The amorphous state is characterized by a higher electrical resistance than the crystalline state. Switching between these two states generates a reversible difference in electrical resistance that can be harnessed for a variety of applications.

Materials that exhibit fast and reversible phase changes are in high demand for many semiconductor applications. Particular applications for this technology include memory cell devices that store binary information. These devices can be classified as either a volatile memory device or a non-volatile memory device. A volatile memory device may lose data stored in the device when power is removed from the device. On the other hand, a nonvolatile memory device may retain its data even without power.

PCM memory devices have the potential to compete with existing memory devices due to their comparatively high resistivity in both the amorphous and crystalline states. High resistivities lead to a high voltage drop and higher power deposition for a given current pulse, which in turn requires less current to switch the cell from the crystalline state to the amorphous state and vice versa.

PCMs commonly applied in this technology include chalcogenide metal alloys composed of germanium (Ge), antimony (Sb) and Tellurium (Te), for example, $Ge_2Sb_2Te_5$ (GST). Examples of metal alloys utilized as PCMs disclosed in the prior art include: WO 2007/029938 which relates to a phase change memory device using an antimony-selenium metal alloy. The material has a low melting point and high speed of crystallization. US 2007/0001160 discloses a phase change memory material wherein the base material is an antimony-tellurium binary solution, an antimony-germanium binary solution, an antimony-indium binary solution or an antimony-gallium binary solution. The solutions disclosed are in the eutectic range. However, a disadvantage of conventional metal alloy PCMs is their tendency to degrade in high volume switching activity.

One promising approach for the fabrication of resistive nonvolatile memory cells is based on the use of solid solutions as an active (switching) material for nonvolatile memory cells. A memory cell of this type has a layer of a solid solution phase change material arranged between a first electrode and a second electrode.

Solid solution PCMs are known in the prior art. Solis et al (FAST CRYSTALLIZING GeSb ALLOYS FOR OPTICAL-DATA STORAGE Journal of Applied Physics, 1994, vol. 75, N12 June 15, pp. 7788-7794) disclose fast reversible optical storage materials in which amorphous-crystalline cycling is achieved by employing ultra-short laser pulses. A high-reflectivity extended solid solution of germanium in crystalline antimony is also disclosed.

Afonso et al. (ULTRAFAST ERASABLE OPTICAL STORAGE IN Sb-RICH GeSb FILMS The 1994 Conference on Lasers and Electro-Optics Europe, Amsterdam, Netherlands, 28 Aug,-2 Sept., 1994. Publisher: IEEE Piscataway, N.J.) disclose the use of films of solid solutions of germanium and antimony for recording micron-sized bits for optical discs. A specific alloy composition disclosed in the article is 13% germanium in antimony, which is very near the eutectic. Neither of the two articles discloses the use of solid solutions for phase change memory cell devices.

None of the above-cited references, taken either alone or in combination, anticipate the present invention as disclosed and claimed herein.

SUMMARY OF THE INVENTION

A semiconductor memory device may be classified as either a volatile memory device or a non-volatile memory device. Flash memory devices, which are a type of nonvolatile memory device, are frequently used for storing data. However, flash memory devices are not generally configured as random access memory devices. In addition, flash memory devices are disadvantageous in that the time required for reading or writing data from or to such devices may be relatively long.

The present invention relates to electrical phase-change memories. In particular, a system and method of operation are provided for the phase-change memory cells using a multipulse reset write scheme. Phase-change materials may exhibit at least two different states. Consequently, phase-change material may be used in a memory cell to store a bit of data. The states of a phase change material may be referred to as amorphous and crystalline states. These states may be distinguished because the amorphous state generally exhibits higher resistivity than does the crystalline state. Generally, the amorphous state involves a more disordered atomic structure, while the crystalline state involves an ordered lattice.

A phase change composition, useful in fast switching and high endurance applications, is an embodiment of the present invention. The phase change composition comprises a solid solution and, optionally, a dopant. The solid solution consists essentially of antimony as a solvent and a solute which is a member selected from the group consisting of germanium, arsenic, tellurium, strontium, sulfur, tin and mixtures thereof.

DETAILED DESCRIPTION OF THE INVENTION

Figure 1:
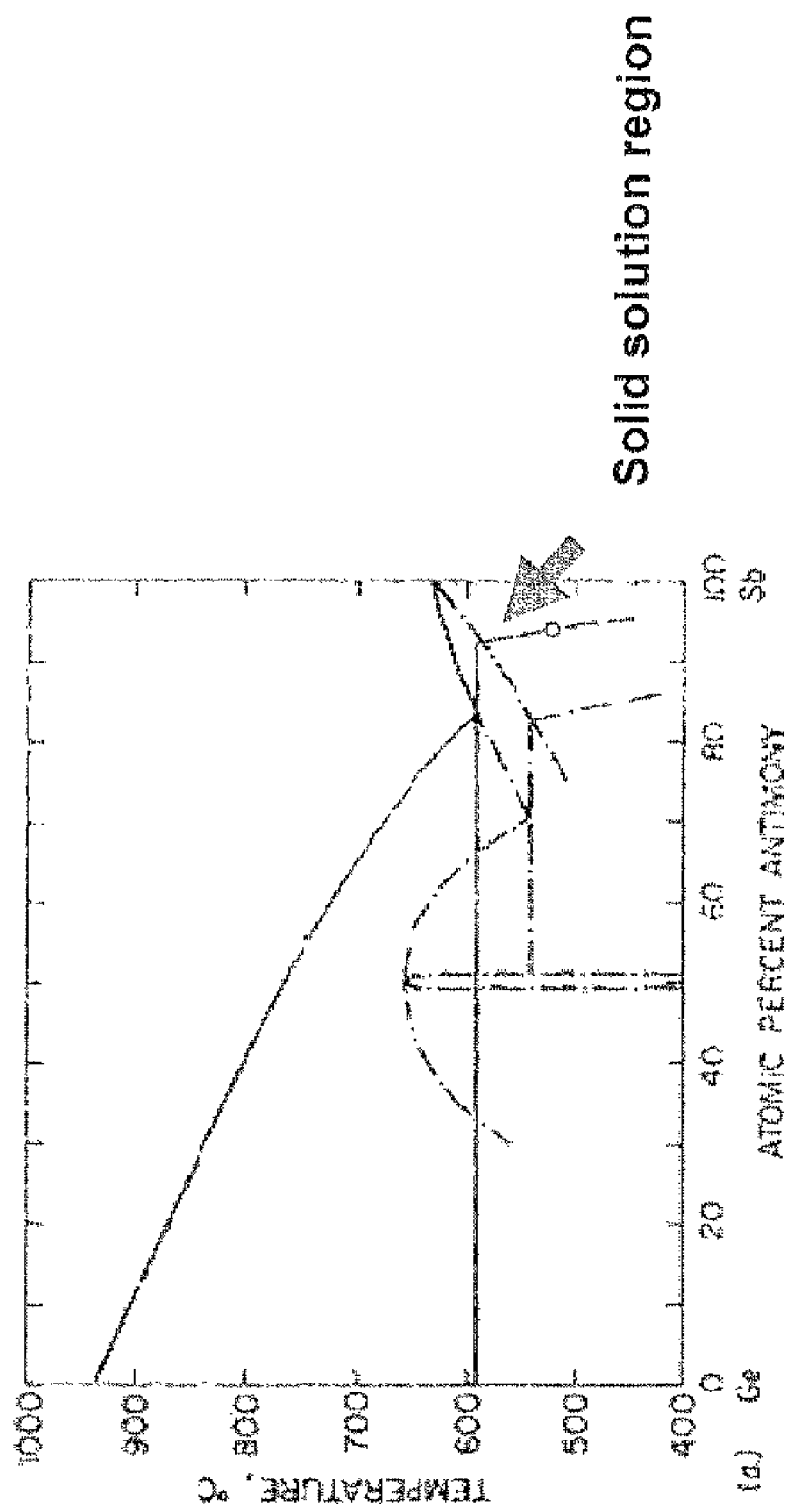
FIG. 1 is a phase diagram of a GeSb composition.

An embodiment of the present invention is a phase change composition, useful in fast switching and high endurance applications. The phase change composition comprises a solid solution and, optionally, a dopant. The solid solution consists essentially of antimony as a solvent and a solute which is a member selected from the group consisting of germanium, arsenic, tellurium, strontium, sulfur, tin and mixtures thereof. In a preferred embodiment, the solute is germanium. Preferably, the germanium is present in the phase change material, excluding dopant, in an amount of about 1% to about 12% based on atomic ratio. Most preferably, the amount of germanium present in the phase change material, excluding dopant, is about 8% based on atomic ratio. The dopant, which is optionally part of the phase change composition, can be in the solid solution. However, in an alternative embodiment, the dopant need not be part of the solid solution. When present, the dopant can be in an amount of at least about 0.01% based on weight. Examples of dopants are: monatomic nitrogen, monatomic oxygen, silicon nitride and silicon monoxide The phase change composition has a crystallization temperature of about 250 degrees C. to about 300 degrees C. The type of dopant, as well as amount, is selected to meet the required crystallization temperature. Time of crystallization is about 20 nanoseconds or less. Preferably, the time of crystallization is about 5 nanoseconds to about 10 nanoseconds. In a most preferred embodiment, the time of crystallization is about 10 nanoseconds.

The phase change composition has a resistivity, when in the crystalline phase, of about 0.001 ohms-cm. to about 0.1 ohms-cm. In a preferred embodiment, the phase change composition has a resistivity, in the crystalline phase, of about 0.01 ohms-cm. In the amorphous phase, the phase change composition has a resistivity that is about 2 to about 5 orders of magnitude greater than the resistivity in the crystalline phase.

Another embodiment of the present invention is a process for preparing a nonvolatile memory cell device. The memory cell device contains a memory element comprising a phase change material having fast switching capability and high endurance. The process comprises the steps of: obtaining a phase change material comprising a solid solution consisting essentially of antimony as a solvent, and a solute which is a member selected from the group consisting of germanium, arsenic, tellurium, strontium, sulfur, tin and mixtures thereof, and, optionally, a dopant; and embedding the phase change material in a substrate comprising an insulating material. A first side of the phase change material is then contacted with a first electrode; and a second side of the phase change material is contacted with a second electrode. The first and second electrodes are in contact with at least one word line and at least one bit line. The first and second electrodes can then co-operate to pass an electrical current through the phase change material.

Another embodiment of the present invention is a phase change memory cell device comprising a phase change material comprising a solid solution and, optionally, a dopant. The solid solution comprises a solvent and a solute. The solvent is antimony and the solute is a member selected from the group consisting of germanium, arsenic, tellurium, strontium, sulfur, tin and mixtures thereof.

Another embodiment of the invention is a device that includes a phase change material that includes the elements Ge and Sb, existing as a solid solution, as well as, optionally, at least one dopant. The dopant can be a nitride compound. The dopant constitutes at least 1 atomic percent of the phase change material. The dopant and concentrations of the dopant and the elements are selected so that the phase change material has a crystallization temperature of at least 250 degrees C. and a resistivity, in the crystalline phase, of at least 0.001 ohm-cm. In an exemplary embodiment, said solid solution and dopant, as well as the concentrations of the dopant and said solid solution, are selected so that the phase change composition has a crystallization temperature of at least 270 degrees C. and a resistivity, in the crystalline phase, of at least 0.01 ohm-cm.

The memory device further includes a component that includes at least one of the following: a) electrodes for passing current through the phase change material, thereby heating the phase change material, b) a scanning probe microscopy-based element for applying heat to the phase change material, and c) a laser having output used to heat the phase change material. This component enables at least one of the following: reading data from the phase change material and writing data into the phase change material. In one preferred embodiment, electrodes are disposed on different sides of the phase change composition for conducting electrical current through the phase change material. A substrate underlies the phase change material. A capping layer covers the phase change composition.

In theory, the present invention is based on the concept that antimony alone is a very fast phase change material. However, due to the nature of the element, a PCM with pure antimony is desirable but not practical. A minor amount of another elemental material therefore is needed in order for the antimony to function in a device employing a phase change composition. The other material can be a chalcogenide, but it does not have to be a chalcogenide. The minor amount of added material must form a homogeneous phase with the antimony, hence a solid solution. Dopant that can be present in the phase change composition cannot be present in an amount that will destroy the solid solution.

A solid solution relates to a composition where there is present on the atomic level a solid-state solution of at least one solute in a solvent. The solid-state solution is a mixture that is a solution rather than a compound because the crystal structure of the solvent remains unchanged upon addition of the one or more solutes. The mixture remains in a single homogeneous phase.

There are two possible methods of incorporation of the solute into the solvent. A solvent particle in the lattice can be replaced by solute. This is known as the substitutional method. The second method is the interstitional method, whereby a solvent particle fits into the space between solvent particles in the lattice. In both cases, the crystal lattice of the solvent is distorted, thus disrupting the physical and electrical homogeneity of the solvent material.

In order to form solid solutions, the solute and solvent have certain features such as: similar atomic radii (15% or less difference), same crystal structure, similar electronegativities, and similar valency. Even small amounts of solute can affect the electrical and physical properties of the solvent.

FIG. 1 relates to an equilibrium phase diagram of a germanium-antimony composition wherein the solid solution is obtained when the amount of germanium is present in an amount from trace to about 12% based on atomic ratio. The antimony is the solvent in the solid solution. The solid lines in the diagram relate to the phase diagram, and the dashed lines relate to the tentative metastable equilibria involving germanium and antimony. One embodiment of the present invention is a method of preparing a phase change memory cell device wherein the storage medium comprises a phase change composition that is a solid solution of germanium in antimony. In a most preferred embodiment, the solid solution consists of 8% germanium-antimony, wherein the percentage refers to the amount of germanium present in the solid solution based on atomic ratio.

Figure 2:
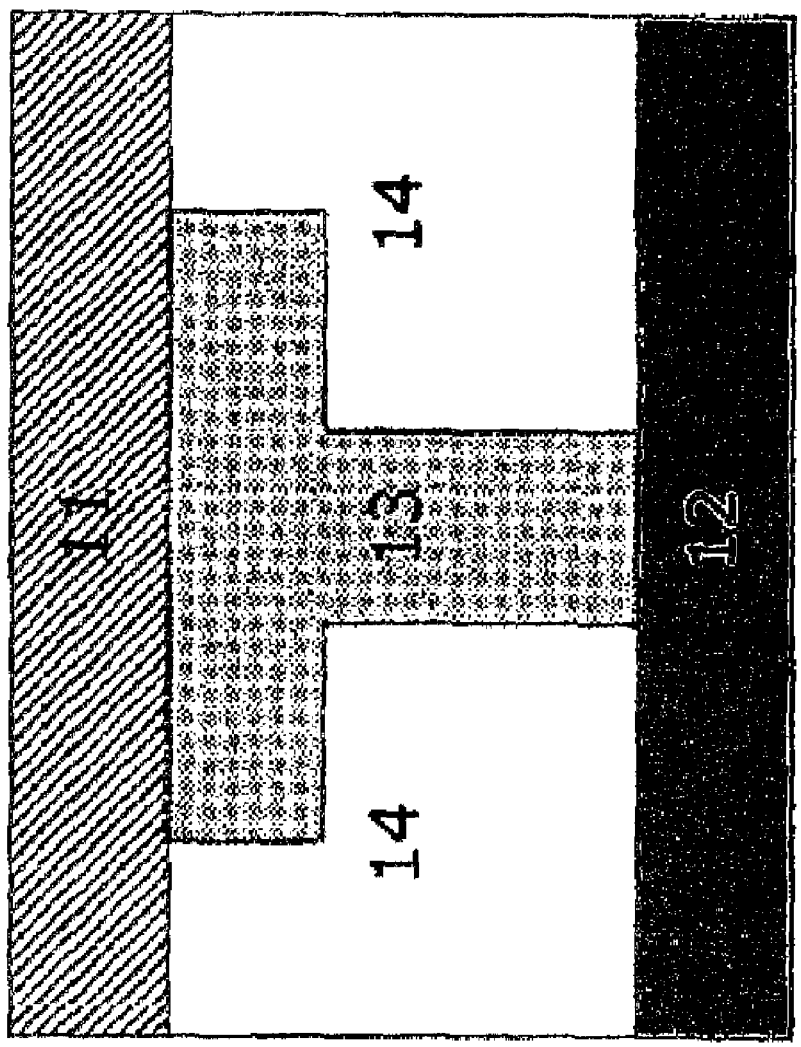
FIG. 2 is a representation of a memory cell containing a memory element comprising a solid solution phase change material.

FIG. 2 is a representative drawing of a phase change memory cell device. A top electrode 11 is positioned next to one side of a phase change memory element 13. A bottom electrode 12 is positioned next to other side of the phase change memory element 13. The phase change memory element 13 comprises a solid solution of antimony as the solvent, and a solute which is a member selected from the group consisting of germanium, arsenic, tellurium, strontium, sulfur, tin and mixtures thereof. The phase change memory element 13 also contains at least one dopant material. The dopant can be part of the solid solution. The dopant can, alternatively, be separate from the actual solid solution. The memory element 13 is embedded in an insulation layer 14.

Figure 3:
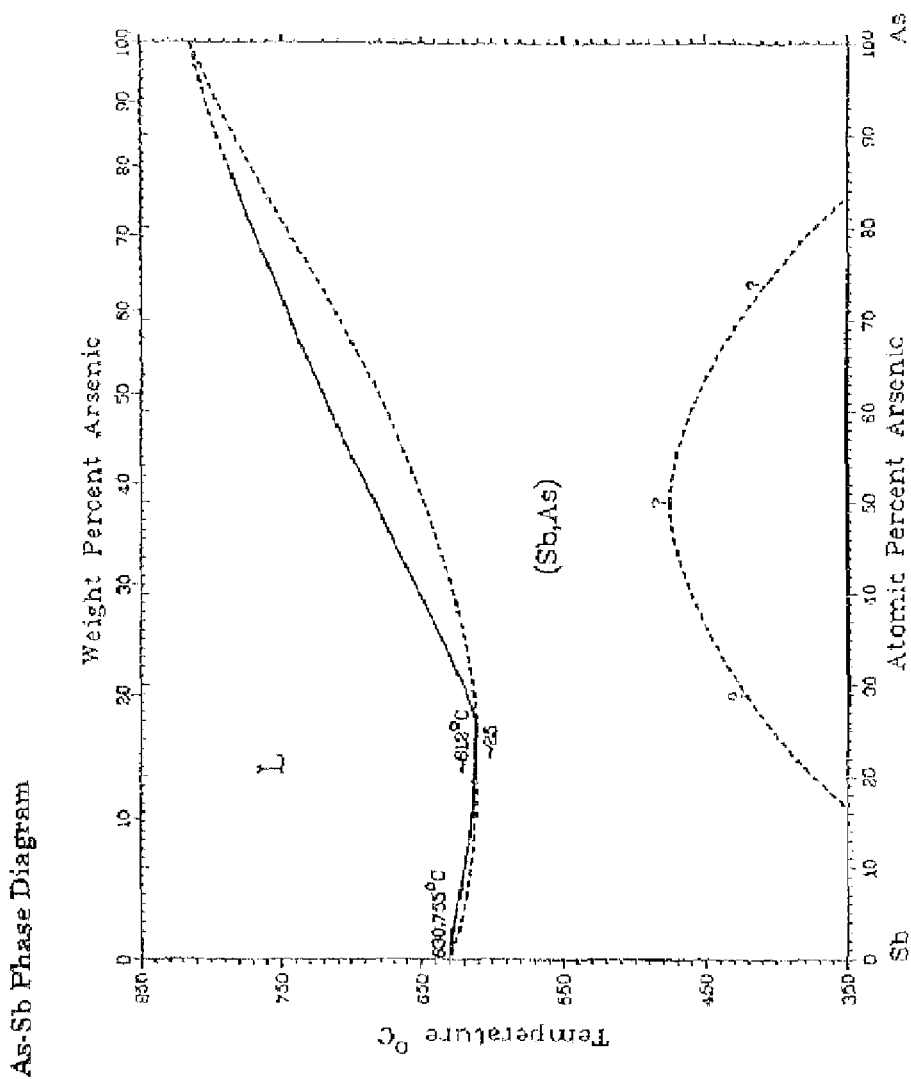
FIG. 3 is a phase diagram of an AsSb composition.

FIG. 3 relates to an equilibrium phase diagram of an arsenic-antimony composition wherein the solid solution is obtained in all concentrations of arsenic and antimony. The area represented by (Sb,As) is the solid solution phase of the binary alloy. The area below the dotted line having question marks above the line represents concentrations where the solid solution phase is questionable. The present invention includes all possible concentrations of arsenic, as long as the antimony in the binary alloy is the solvent in the solid solution.

Figure 4:
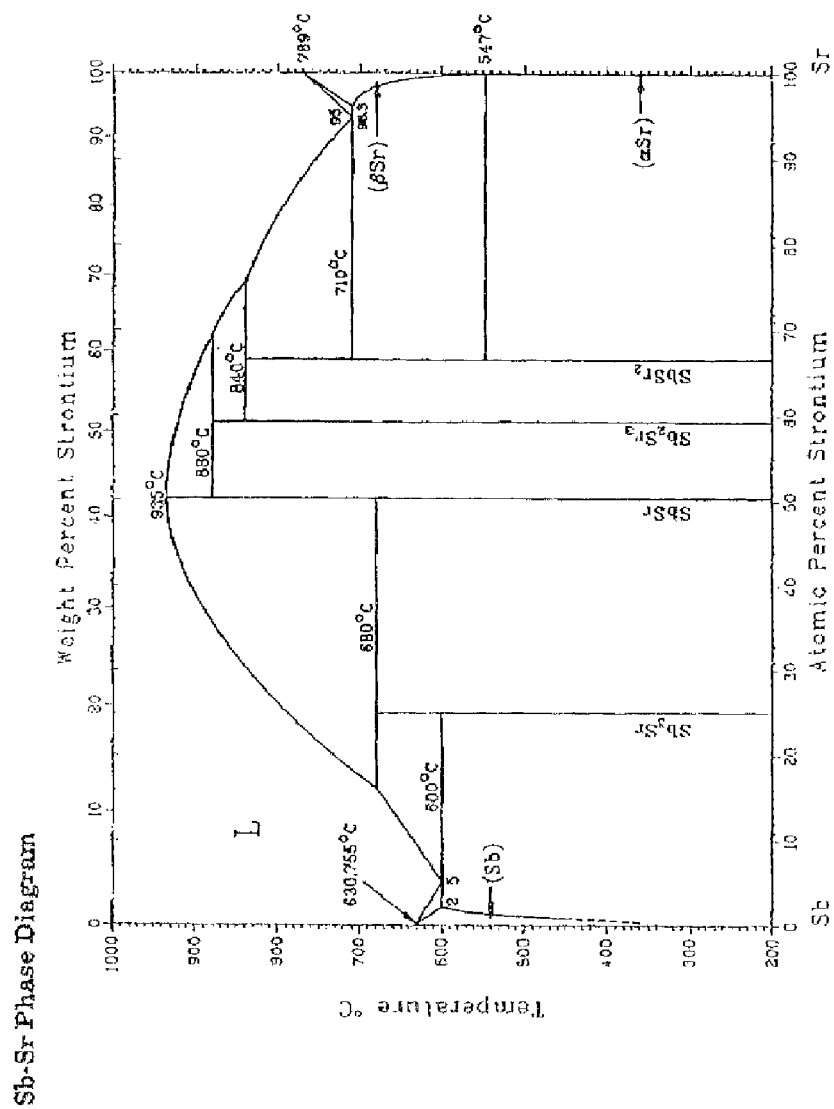
FIG. 4 is a phase diagram of a SrSb composition.

FIG. 4 relates to an equilibrium phase diagram of a strontium-antimony composition wherein the area designated as (Sb) is the solid solution phase of the binary alloy. Thus, the amount of strontium in the solid solution is from trace to about 2% based on atomic ratio.

Figure 5:
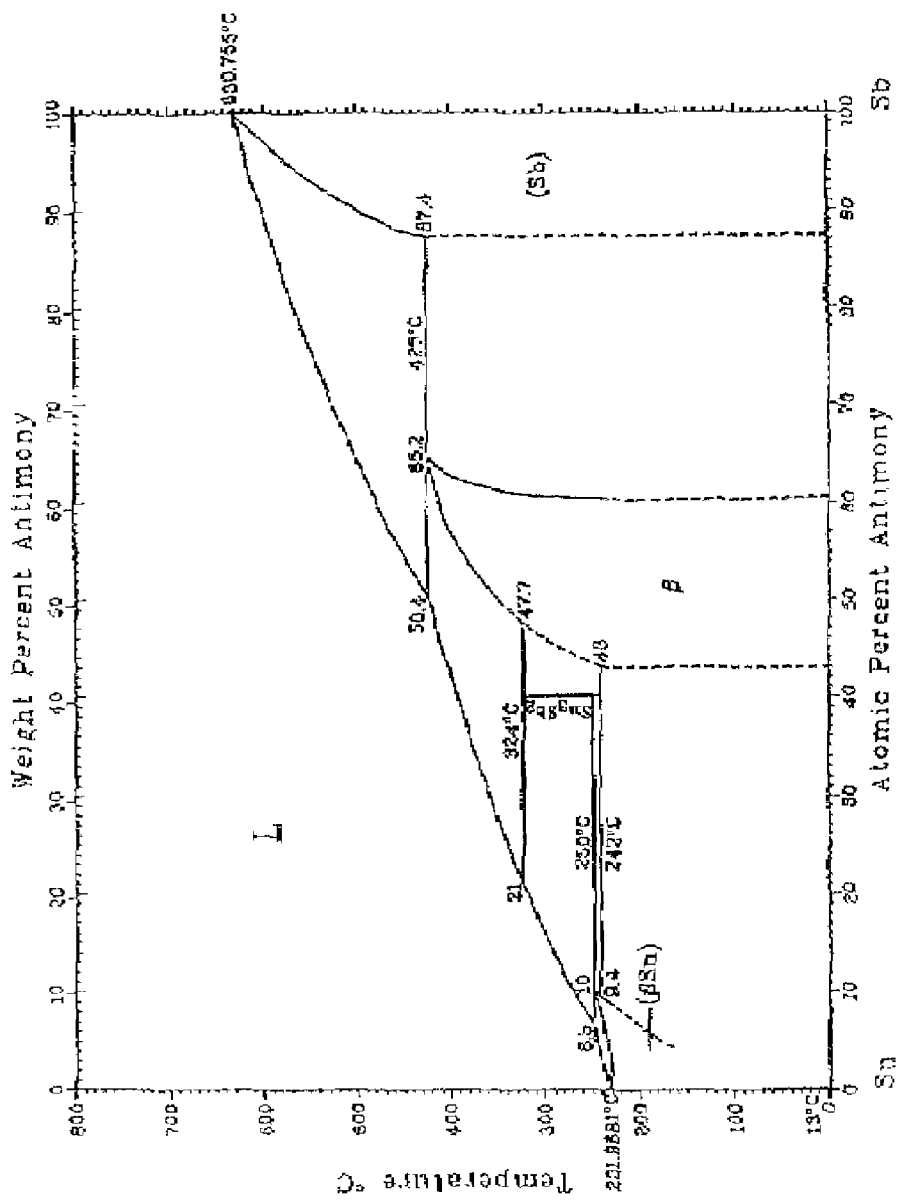
FIG. 5 is a phase diagram of a SnSb composition.

FIG. 5 relates to an equilibrium phase diagram of a tin-antimony composition wherein the area designated as (Sb) is the solid solution phase of the binary alloy. Thus, the amount of tin in the solid solution is from trace to about 12% based on atomic ratio.

A phase change memory element is locally heated to a temperature higher than the melting point and then rapidly cooled to form amorphous marks. On the other hand, the memory element is heated at a temperature of approximately at most the melting point and at least the crystallization temperature, and slowly cooled so that the memory element is kept at a temperature of at least the crystallization temperature for a certain retention time to carry out recrystallization. Namely, a reversible change between the stable crystalline phase and the amorphous phase is utilized, and the information is recorded or retrieved by detecting the difference in physical parameters such as refractive index, electric resistance, volume and change in density, between the crystalline state and the amorphous state.

Phase change in the phase-change materials may be induced reversibly. In this way, the memory may change from the amorphous to the crystalline state, and vise versa, in response to temperature changes. The temperature changes to the phase-change material may be effectuated in a variety of ways. For example, a laser can be directed to the phase-change material, current or voltage may be driven through the phase change material, or current or voltage can be fed through a resistive heater adjacent the phase change material. With any of these methods, controllably heating the phase-change material causes controllable phase change with the phase-change material.

Phase-change compositions of the present invention comprise solid solutions. Preferably, the solid solutions contain antimony. In a most preferred embodiment of the present invention, the antimony in the solid solution is the solvent. That is, the solid solution is antimony-based.

When a storage medium comprising an antimony-based solid solution is employed in a memory cell device, switching times and the switching energies required for the transitions between the amorphous and the crystalline states are substantially reduced below those attainable with prior art electrically erasable phase change memories. One embodiment of the invention comprises an integrated circuit implementation of the memory in a high bit density configuration in which manufacturing costs are correspondingly reduced and performance parameters are further improved.

Generally, not all of the phase change material in a memory cell device undergoes phase change. The portion of the layer of the phase-changeable material where the phase change occurs may be referred to as the "programming region." When the programming region has an amorphous state, the state of a PRAM (phase change random access memory) device is referred to as the "reset state." On the other hand, when the programming region has a crystalline state, the state of the PRAM device is referred to as the "set state." The resistance of the portion of the programming region making contact with the lower electrode may be relatively high in the reset state. On the other hand, the resistance of the portion of the programming region making contact with the lower electrode is relatively low in the set state.

Another embodiment of the present invention relates to a phase change memory device having a phase-changeable material layer pattern. This embodiment of the invention provides for a phase change memory device including a phase-changeable material layer pattern, wherein the phase change material comprises an antimony-based solid solution. Thus, in memory devices according to this embodiment of the invention, some electrical characteristics of the phase-changeable memory device may be improved. Additionally, cells of a phase change memory device formed in accordance with this embodiment of the invention may be highly integrated.

Another embodiment of the present invention relates to a method of manufacturing a phase change memory device comprising: forming an insulating interlayer on a silicon substrate; forming a silicon nitride layer on the insulating interlayer; forming an opening in the silicon nitride layer and the insulating interlayer; forming a lower electrode in the opening, the lower electrode making contact with a contact region of the substrate through the silicon nitride layer and the insulating interlayer; forming a phase-changeable material layer, wherein the phase change material comprises an antimony-based solid solution, on the lower electrode; and forming an upper electrode on the phase-changeable material layer.

Another embodiment of the present invention relates to a phase change memory device comprising: a substrate of silicon having a contact region therein; an insulating interlayer on the substrate; a silicon nitride layer on the insulating interlayer; a lower electrode extending through the silicon nitride layer and the insulating interlayer and in electrical contact with the contact region of the substrate; a phase-changeable material layer pattern, wherein the phase-changeable material is an antimony-based solid solution, on the lower electrode and the silicon nitride layer; and an upper electrode on the phase-changeable material layer pattern.

Various phase change materials based on solid solutions are disclosed herein that may be advantageously used as the memory element in a device used for information storage and/or retrieval. In one embodiment, the device includes a solid state memory cell array, in which each cell has phase change material (PCM) situated between two electrodes through which current is passed. Electrical current is used to selectively change the phase of the PCM in the memory elements, thereby recording data in them. Current is also used for determining the phase of the PCM, thereby allowing data to be read from the elements. In another embodiment, a laser is used to record data in, or read data from, a layer of phase change material. In yet another embodiment, a scanning probe microscopy-based element is used to write data into, or read data from, a layer of PCM.

The memory cells themselves can be rather complicated. In one embodiment, each cell includes a MOSFET (metal oxide semiconductor field effective transistor) and a phase change storage element that includes PCM. Each phase change storage element, comprising a solid solution based on antimony, is in electrical communication with a particular wordline and a particular bitline. The MOSFET is connected to the phase change storage element via a conductive line. The gate of the MOSFET is connected to a wordline. The phase change memory element is also connected to a bitline via another conductive line. In an alternative embodiment, a simplified memory cell can be employed in which the cell consists only of a phase change memory element tied directly to a respective wordline and a respective bitline.

In still other embodiments, the memory cell may include a bipolar junction transistor (BJT) and a phase change memory element, wherein the phase change storage material comprises a solid solution wherein antimony is the solvent. In yet another embodiment, a diode and a phase change memory element are included in the memory cell. Another embodiment of the present invention includes a memory cell that contains a tunneling diode and a phase change memory element.

The electrodes in the memory device can be formed from TiN, TiW, W, or another electrically conducting material. The electrodes are in electrical communication with the wordline and the bitline. By passing current through the phase change material, it can be programmed into a desired state (e.g., amorphous or crystalline) or have its state read out. Phase change memory elements can also include additional layers, such as heater layers and buffer layers.

The memory element can be formed by various methods known to one of ordinary skill in the art. One such method is reactive sputtering of various elemental targets in a mixture of nitrogen and a noble gas such as argon. Another method is by employing a compound phase change material target such as Ge(8%)Sb(92%), and co-sputtering the dopant in, for example, a gas mixture of nitrogen and a noble gas. Alternatively, the phase change memory element can be formed by sputtering from a compound target that contains all the required elements. The dopant concentration can be adjusted by varying the sputter conditions, such as the gas flow rate, the sputter power of the respective guns, and the compositions of the sputter targets themselves.

Other deposition methods can include: thermal evaporation, laser ablation, chemical vapor deposition, and spin-coating deposition. The memory element can advantageously have a dopant concentration that is not uniform throughout the phase change material.

Information is written into the phase change material of the recording layer by passing an electric current through the phase change material. If the phase change material of the memory device is initially amorphous and then heated to above the crystallization temperature for a long enough time, a phase transformation from the amorphous state to the crystalline state is induced. On the other hand, if crystalline phase change material is heated with an even higher current and then quickly cooled (melt-quenched), the phase change material is transformed back to the amorphous state.

Information is read by a small electrical current that passes through the phase change material. This current is too small to induce a phase transformation but still large enough to detect the resistivity of the phase change material, thereby determining whether the phase change material is in the amorphous or the crystalline state.

EXAMPLE

A phase change composition is prepared by forming a thin film by deposition of said film on silicon wafer substrate through the co-sputtering of germanium and antimony in the presence of a gaseous mixture of argon and nitrogen. The silicon substrate is previously coated with a layer of silicon oxide at a thickness of about one micrometer. The composition of the thin film is determined by means such as Rutherford Back Scattering Analysis. The film contains a solid solution of antimony and germanium. The content of the germanium is about 8% based on atomic ratio. Resistivity as a function of temperature is then measured by forming two contacts on the sample, the contacts having well-defined geometry. The resistivity between these contacts is then measured while heating the sample in a nitrogen atmosphere to prevent oxidation. The resistivity is about 0.01 ohms/cm.

While the invention has been described by specific examples and embodiments, there is no intent to limit the inventive concept except as set forth in the following claim.

We claim:

1. A process for preparing a nonvolatile memory device comprising a phase change material as a memory element, the process comprising:

obtaining a phase change material comprising a solid solution consisting essentially of antimony as a solvent, and a solute which is a member selected from the group consisting of germanium, arsenic, tellurium, strontium, sulfur, tin and mixtures thereof; and, optionally, a dopant; wherein the solid solution is a mixture that is a solution rater than a compound;

embedding the phase change material in a substrate comprising an insulating material;

contacting a first side of the phase change material with a first electrode; and contacting a second side of the phase change material with a second electrode; wherein the first and second electrodes are in contact with at least one word line and at least one bit line; and whereby the first and second electrodes co-operate to pass an electrical current through the phase change material; to obtain the nonvolatile memory device; and wherein the crystal structure of the solvent remains unchanged upon addition of the one or more solutes, and the mixture remains in a single homogeneous phase.

* * * * *